United States Patent
Shimizu

(10) Patent No.: US 6,457,233 B1
(45) Date of Patent: Oct. 1, 2002

(54) SOLDER BONDING METHOD, AND PROCESS OF MAKING ELECTRONIC DEVICE

(75) Inventor: Kozo Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/453,278

(22) Filed: Dec. 3, 1999

(30) Foreign Application Priority Data

Jan. 22, 1999 (JP) ............................................ 11-014554

(51) Int. Cl.$^7$ ................................................ H05K 3/34
(52) U.S. Cl. .............................. 29/840; 29/842; 29/843; 29/896; 228/180.1; 228/180.21
(58) Field of Search ........................ 29/843, 842, 846, 29/840; 228/180.1, 180.21

(56) References Cited

U.S. PATENT DOCUMENTS

| | | | |
|---|---|---|---|
| 3,373,481 A | * | 3/1968 | Lins et al. |
| 3,495,133 A | * | 2/1970 | Miller |
| 3,724,068 A | * | 4/1973 | Galli |
| 4,237,607 A | * | 12/1980 | Ohno ........................... 29/827 |
| 5,719,070 A | * | 2/1998 | Cook et al. |
| 5,767,010 A | * | 6/1998 | Mis et al. |

FOREIGN PATENT DOCUMENTS

JP                 01-007542         *  1/1989

OTHER PUBLICATIONS

Mallory et al, Electrochemical Society Fall Meeting, pp 423–424, 1975, held on Oct. 5–10 1975, Dallas, TX.*

* cited by examiner

Primary Examiner—Carl J. Arbes
(74) Attorney, Agent, or Firm—Armstrong, Westerman & Hattori, LLP

(57) ABSTRACT

A solder bonding method comprises the step of solder bonding a first electrode 30 to a second electrode 16 having a solder bump 18 of mainly Sn formed on the upper surface thereof. The first electrode 30 and/or the second electrode 16 includes metal layers 14, 26 formed of an alloy layer containing Ni and P, an alloy layer containing Ni and B, or an alloy layer containing N, W and P. The metal layer of the alloy layer containing impurities, such as P, etc. can prevent the Ni of the metal layer from combining with the Sn in the solder bump. Accordingly, good bonded states can be obtained.

7 Claims, 4 Drawing Sheets

SOLDER BONDING METHOD, AND PROCESS OF MAKING ELECTRONIC DEVICE

CROSS-REFERENCE TO RELATED APPLICATIONS

This application is based upon and claims priority of Japanese Patent Application No. Hei 11-14554, filed, the contents being incorporated herein by reference.

BACKGROUND OF THE INVENTION

The present invention relates to a solder bonding method, and an electronic device and a process for fabricating the electronic device, more specifically to a solder bonding method using a solder material containing Sn as a main component, and an electronic device and a process for fabricating the electronic device.

Recently, in view of the high-speed operation of semiconductor devices, techniques for short wiring lengths have been required. What is noted is flip chip bonding in which specifically solder bumps formed on a semiconductor chip are mounted on a circuit substrate with electrodes formed on, and are melted by heating for bonding.

The solder bonding method by the conventional flip chip bonding will be explained with reference to FIG. 4.

First, an electrical wiring 111 is formed of an Al film on a semiconductor substrate 110 with a prescribed device. Next, an electrode 116 is formed of a Ti film, an Ni film 113 and an Au film 114 on an electrical wiring 111, and a solder bump 118 is formed on the electrode.

On the other hand, an electrode 130 is formed of a Cr film 122, a Cu film 124, an Ni film 126 and an Au film 128 on an alumina substrate 120 with a prescribed circuit. Thus, the circuit substrate 132 with the electrode 130 formed on is formed.

Then, the solder bump 118 on the semiconductor substrate 110 is aligned with the electrode 130 on the circuit substrate 120, and is heated for the flip chip bonding. Such flip chip bonding makes the connection by means of lead wires unnecessary. The wiring length can be short.

Conventionally, Pb—Sn (Pb: lead, Sn: tin)-based solder materials have been widely used in the flip chip bonding. However, the Pb contained in Pb—Sn-based solder materials have isotopes, and the isotopes are intermediate products or terminal products of the decay series of U (uranium) and Th (thorium). Uranium (U) and thorium (Th) decay by the emission of He (helium), the solder materials emit a-rays. The α-rays affect the operations of semiconductor devices, often causing the so-called soft errors. In a case that Pb flows into soil, the Pb is solved by acid rain, often affecting environments. From the ecological viewpoint, solder materials containing Pb as a non-main component are required.

As a solder material which replaces the Pb—Sn-based solder materials, solder materials containing Sn as a main component is noted.

However, in a case that a solder material containing Sn as a main component is used, because the Ni and Cu in the electrodes 116, 130 are reactive to the Sn in the solder bump 118, heat applied by the flip chip bonding produces metal compounds, etc., such as Ni—Sn, Cu—Sn, etc. When the Ni reacts to the Sn, and the Ni film 113 is lost, it is difficult that the bonding between the solder bump 118, and the electrodes 116, 130 can be satisfactory because the Ti film 112, for example, and the solder bump 118 are incompatible with each other. In reliability test, such as a heat-cycle test, etc., the bonding was defective, and conduction, etc. are unsatisfactory. The reliability is poor.

SUMMARY OF THE INVENTION

An object of the present invention is to provide a solder bonding method, and an electronic device and a process for fabricating the electronic device, which make the bonding satisfactory even by the use of a solder material containing Sn as a main component.

The above-described object is achieved by a solder bonding method comprising the step of solder bonding a first electrode to a second electrode having a solder bump of mainly Sn on an upper surface thereof, the first electrode and/or the second electrode including a metal layer of an alloy layer containing Ni and P, an alloy layer containing Ni and B, or an alloy layer containing Ni, W and P. The metal layer of an alloy layer containing impurities, such as P, etc. can prevent the Ni of the metal layer from combining with the Sn in the solder bump. Accordingly, good bonded states can be obtained.

The above-described object is achieved by a solder bonding method comprising the step of solder bonding a first electrode to a second electrode having a solder bump of mainly Sn formed on an upper surface thereof, the first electrode and/or the second electrode including a metal layer of mainly Ni, and the solder bonding step being followed by the step of heat treating the alloy layer. The heat treatment can crystallize the metal layer, whereby the Ni of the metal layer can be prevented from combining with the Sn in the solder bump.

The above-described object is achieved by an electronic device comprising a first substrate including a first electrode, a second substrate including a second electrode having a solder bump of mainly Sn formed on an upper surface thereof, the first electrode and the second electrode being solder bonded to each other, the first electrode and/or the second electrode including a metal layer of an alloy layer containing Ni and P, an alloy layer containing Ni and B, or an alloy layer containing Ni, W and P. The metal layer of an alloy layer containing impurities, such as P, etc. can prevent the Ni of the metal layer from combining with the Sn in the solder bump. Accordingly, good bonded states can be obtained. Electronic devices having good bonded states can be provided.

The above-described object is achieved by an electronic device fabrication process comprising the step of solder bonding a first electrode formed on a first substrate to a second electrode which is formed on a second substrate and has a solder bump of mainly Sn formed on an upper surface thereof, the first electrode and/or the second electrode including a metal layer of an alloy layer containing Ni and P, an alloy layer containing Ni and B, or an alloy layer containing Ni, W and P. The metal layer of an alloy layer containing impurities, such as P, etc. can prevent the Ni of the metal layer from combining with the Sn in the solder bump. Accordingly, a process for fabricating electronic devices having good bonded states can be provided.

The above-described object is achieved by an electronic device fabrication process comprising the step of solder bonding a first electrode formed on a first substrate to a second electrode which is formed on a second substrate and has a solder bump of mainly Sn formed on an upper surface thereof, the first electrode and/or the second electrode including a metal layer of mainly Ni, and the step of heat treating the metal layer being followed by the solder bonding step. The heat treatment can crystallize the metal layer, whereby the Ni of the metal layer can be prevented from combining with the Sn in the solder bump.

DETAILED DESCRIPTION OF THE INVENTION

[A First Embodiment]

Figure 1:
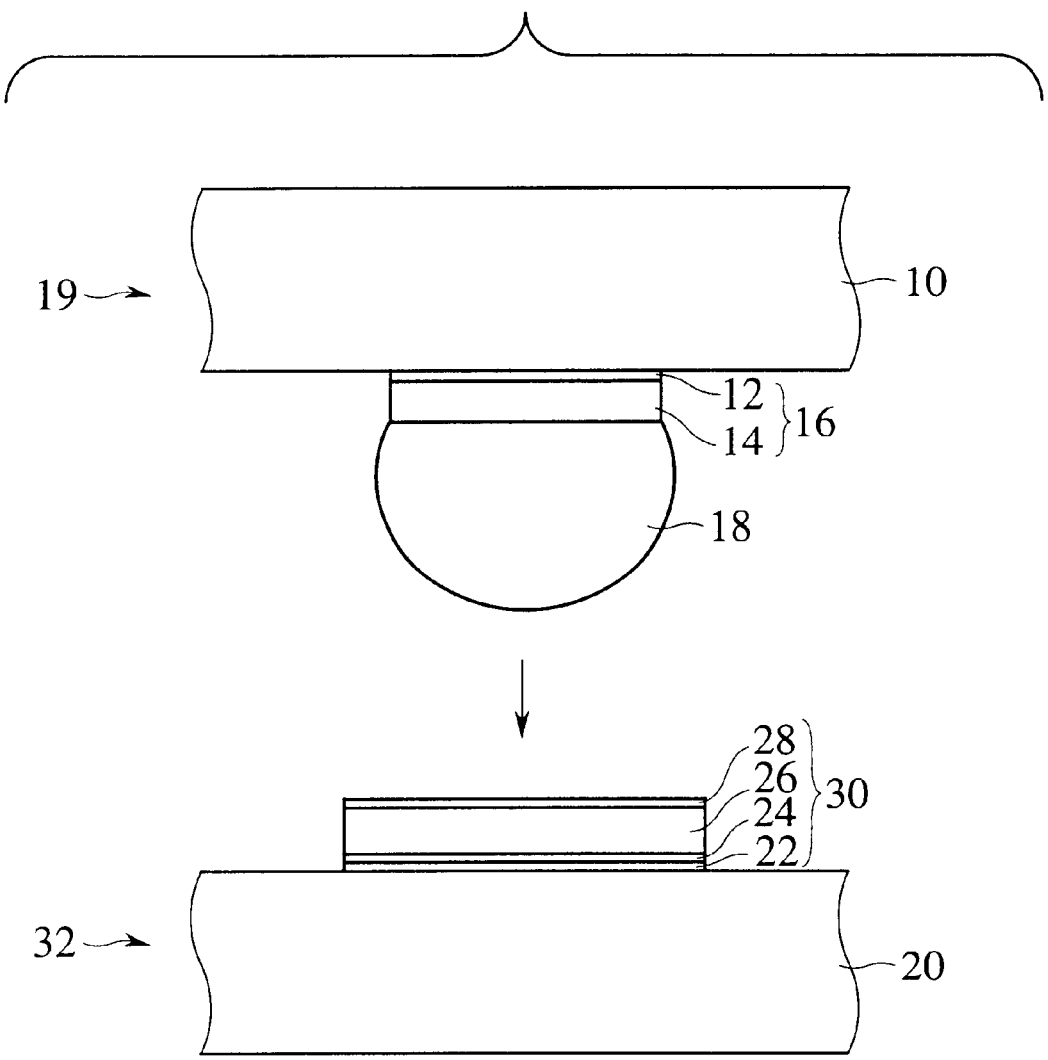
FIG. 1 is a sectional view showing the solder bonding method according to a first embodiment of the present invention.

The solder bonding method according to a first embodiment of the present invention will be explained with reference to FIG. 1. FIG. 1 is a sectional view for explaining the solder bonding method according to the first embodiment of the present invention.

First, a semiconductor substrate 10 of a silicon substrate with a prescribed semiconductor device formed on is prepared. Then, a 100 nm-Ti film 12 is formed on the semiconductor substrate 10 by sputtering. The Ti film 12 is patterned into a plane shape of an electrode 16. The plane shape of the electrode 16 has, e.g., a 70–100 μm-diameter, and a pitch of the electrode 16 with respect to an adjacent one (not shown) is, e.g., 150–210 μm.

Then, a plated film 14 containing Ni and P (phosphorus) is formed on the Ti film 12 by electroless plating. A thickness of the plated film 14 is, e.g., 6 μm, and a phosphorus content of the plated film 14 may be, e.g., 5–20 wt %. The plated film 14 contains P because the Ni of the plated film 14 is prevented from combining with the Sn in the solder bump. A phosphorus content of the plated film 14 is not essentially 5–20 wt %. It is preferable to set a phosphorus content suitably to obtain a required bonded state.

A film thickness of the plated film 14 is suitably set so that a satisfactory bonded state can be achieved even when the Ni of the plated film 14 is combined with the Sn in the solder bump 18 by heat applied upon the flip chip bonding to resultantly thin the plated film 14. Thus, the electrode 16 of the Ti film 12 and the plated film 14 is formed.

Next, a heat treatment is performed at 400–600° C. for about 0.5–2 hours to crystallize the plated film 14. The heat treatment is performed for the following reason. That is, the plated film of the Ni film formed simply by electroless plating has amorphous state, and has weak metal combining force and a number of pin holes. Accordingly, when the plated film formed simply by electroless plating is subjected to heat by the flip chip bonding or others, the Ni of the plated film tends to combine with the Sn in the solder bump. A diffusion velocity of the Ni of the plated film 14 formed by electroless plating is higher by 2–3 times a diffusion velocity of an Ni metal plate or a plated film formed by electrolytic plating. As a result, Ni—Sn-based metal compounds are grown by the flip chip bonding in the plated film formed by electroless plating, and the plated film is lost. In the present embodiment, the plated film 14 formed by electroless plating is crystallized by the heat treatment, so that the Ni of the plated film 14 can be prevented from combining with the Sn in the solder bump 18 to thereby produce Ni—Sn-based compounds. Furthermore, as described above, the plated film 14 contains P. Whereby the Ni of the plated film 14 can be furthermore prevented from combining with the Sn of the solder bump 18. In the present embodiment, the plated film can be formed by electroless plating, which permits the plated film to be formed by simpler process in comparison with electrolytic plating.

Next, a solder bump 18 is formed of a solder material containing Sn as a main component on the electrode 16. As a method for forming the solder bump 18, dimple plating or others, for example, may be used. It is preferable that a Pb concentration of the solder material of the solder bump 18 is, e.g., below 1 ppm. Preferably, an α-ray amount to be emitted from the solder material of the solder bump 18 is, e.g., below 0.01 cph/cm$^2$ for the prevention of soft errors. Thus, a semiconductor device 19 with the solder bump 18 formed on the electrode 16 of the semiconductor substrate 10 is fabricated.

On the other hand, a Cr film 22 and a Cu film 24 are formed on an aluminum substrate 20 by sputtering. Then, the Cr film 22 and the Cu film 24 are patterned into a plane shape of an electrode 30. A diameter of the plane shape of the electrode 30 is, e.g., 70–100 μm, and a pitch of the electrode 30 with respect to an adjacent one (not shown) is, e.g., 150–210 μm.

Next, a 6 μm-thickness plated film 26 is formed on the Cu film 24 by electroless plating. The plated film 26 may be formed in the same way as the plated film 14. Then, a 50 nm-thickness Au film 28 is formed by flash plating. The Au film 28, which is highly reactive to Sn, can contribute to improving a wettability. Thus, the electrode 30 is formed of the Cr film 22, the Cu film 24, the plated film 26 and the Au film 28. Thus, the circuit substrate 32 with the electrode 30 formed on is formed.

Next, the semiconductor device 19 and the circuit substrate 32 are aligned with each other to be subjected to the flip chip bonding in a nitrogen atmosphere in a reflow furnace. Thus, the semiconductor device 19 is mounted on the circuit substrate 32, and an electronic device is fabricated.

(Results of Reliability Evaluation Test)

Results of a reliability evaluation test made on electronic devices fabricated by using the above-described solder bonding method will be explained with reference to Tables 1-1 to 2-2. Tables 1-1 to 2-2 show results of the reliability evaluation test made on the electronic devices fabricated by using the solder bonding method according to the present embodiment.

A diameter of the solder bump 18 was 70–100 μm. A pitch of the solder bump with respect to an adjacent one (not shown) was 150–210 μm. Film thicknesses of the plated films 14, 26 were both 6 μm.

In the reliability evaluation test, a resistance value was measured immediately after the flip chip bonding, and a heat cycle test (−55° C.–125° C.) was repeated to measure a resistance at every 50 cycle. In Tables 1-1to 2-2, a residual film thickness means a residual film thickness of the plated film of an Ni-based alloy formed on the circuit substrate 32. In Controls 1 to 4, films containing no impurity, such as P, etc., were formed by electroless plating, and the heat treatment was not performed.

TABLE 1-1

|  | P Content in Plated Film (wt %) | Heat Treatment Temperature (° C.) | Heat Treatment Time (Hours) |
|---|---|---|---|
| Example 1 | 5 | 400 | 1 |
| Example 2 | 5 | 400 | 1 |
| Example 3 | 5 | 400 | 1 |
| Example 4 | 5 | 400 | 1 |
| Example 5 | 15 | 400 | 1 |
| Example 6 | 15 | 400 | 1 |
| Example 7 | 15 | 400 | 1 |
| Example 8 | 15 | 400 | 1 |
| Control 1 | — | None | None |
| Control 2 | — | None | None |
| Control 3 | — | None | None |
| Control 4 | — | None | None |

TABLE 1-2

|  | Content of Elements other than Sn in Solder Bump (wt %) | Heat Cycle (Cycle) | Bonded State | Residual Film Thickness ($\mu$m) |
|---|---|---|---|---|
| Example 1 | Ag:3.5, Zn:5 | Above 300 | Good | 3 |
| Example 2 | Sb:5 | Above 300 | Good | 3 |
| Example 3 | Ag:3.5 | Above 300 | Good | 3 |
| Example 4 | Ag:3.5, In:5 | Above 300 | Good | 3 |
| Example 5 | Ag:3.5, Zn:5 | Above 300 | Good | 4 |
| Example 6 | Sb:5 | Above 300 | Good | 4 |
| Example 7 | Ag:3.5 | Above 300 | Good | 4 |
| Example 8 | Ag:3.5, In:5 | Above 300 | Good | 4 |
| Control 1 | Ag:3.5, Zn:5 | 200 | Fair | 0–2 |
| Control 2 | Sb:5 | 200 | Fair | 0–2 |
| Control 3 | Ag:3.5 | 150 | Fair | 0–2 |
| Control 4 | Ag:3.5, In:5 | 150 | Fair | 0 |

TABLE 2-1

|  | P. Content in Plated Film (wt %) | Heat Treatment Temperature (° C.) | Heat Treatment Time (Hours) |
|---|---|---|---|
| Example 9 | 5 | 600 | 1 |
| Example 10 | 5 | 600 | 1 |
| Example 11 | 5 | 600 | 1 |
| Example 12 | 5 | 600 | 1 |
| Example 13 | 15 | 600 | 1 |
| Example 14 | 15 | 600 | 1 |
| Example 15 | 15 | 600 | 1 |
| Example 16 | 15 | 600 | 1 |

TABLE 2-2

|  | Content of Elements other than Sn in Solder Bump (wt %) | Heat Cycle (Cycle) | Bonded State | Residual Film Thickness ($\mu$m) |
|---|---|---|---|---|
| Example 9 | Ag:3.5, Zn:5 | Above 300 | Good | 4 |
| Example 10 | Sb:5 | Above 300 | Good | 4 |
| Example 11 | Ag:3.5 | Above 300 | Good | 4 |
| Example 12 | Ag:3.5, In:5 | Above 300 | Good | 4 |
| Example 13 | Ag:3.5, Zn:5 | Above 300 | Good | 4 |
| Example 14 | Sb:5 | Above 300 | Good | 4 |
| Example 15 | Ag:3.5 | Above 300 | Good | 4 |
| Example 16 | Ag:3.5, In:5 | Above 300 | Good | 4 |

As shown by Controls 1 to 4 in Tables 1-1 and 1-2, the plated film containing no impurity, such as P or others, was formed by electroless plating and was not subjected to the heat treatment, a residual film thickness of the plated film was as thin as about 0–2 $\mu$m. Good bonded state could not be maintained. "Fair" indicating a bonded state means "bonded, but the bonded state is not good".

In contrast to this, as shown in Examples 1 to 16 in Tables 1-1 to 2-2, the plated films 14, 26 contained P and were subjected to the heat treatment. Residual film thicknesses of the plated films 14, 26 was above 3 $\mu$m both with a 5 wt % P content and a 15 wt % P content. Good bonded states were maintained.

As described above, according to the present embodiment, the plated films of Ni films formed by electroless plating are crystallized by the heat treatment, whereby the Ni of the plated films can be prevented from combining with the Sn in the solder bump. The bonded state can be good. In the present embodiment, the plated films are formed by the electroless plating, which makes the step of forming the plated films simple.

In the present embodiment, the plated film is containing Ni as a main component contain P. Whereby the Ni of the plated films can be prevented from combining with the Ni in the solder bump. The bonded state can be good.

[A Second Embodiment]

Figure 2:
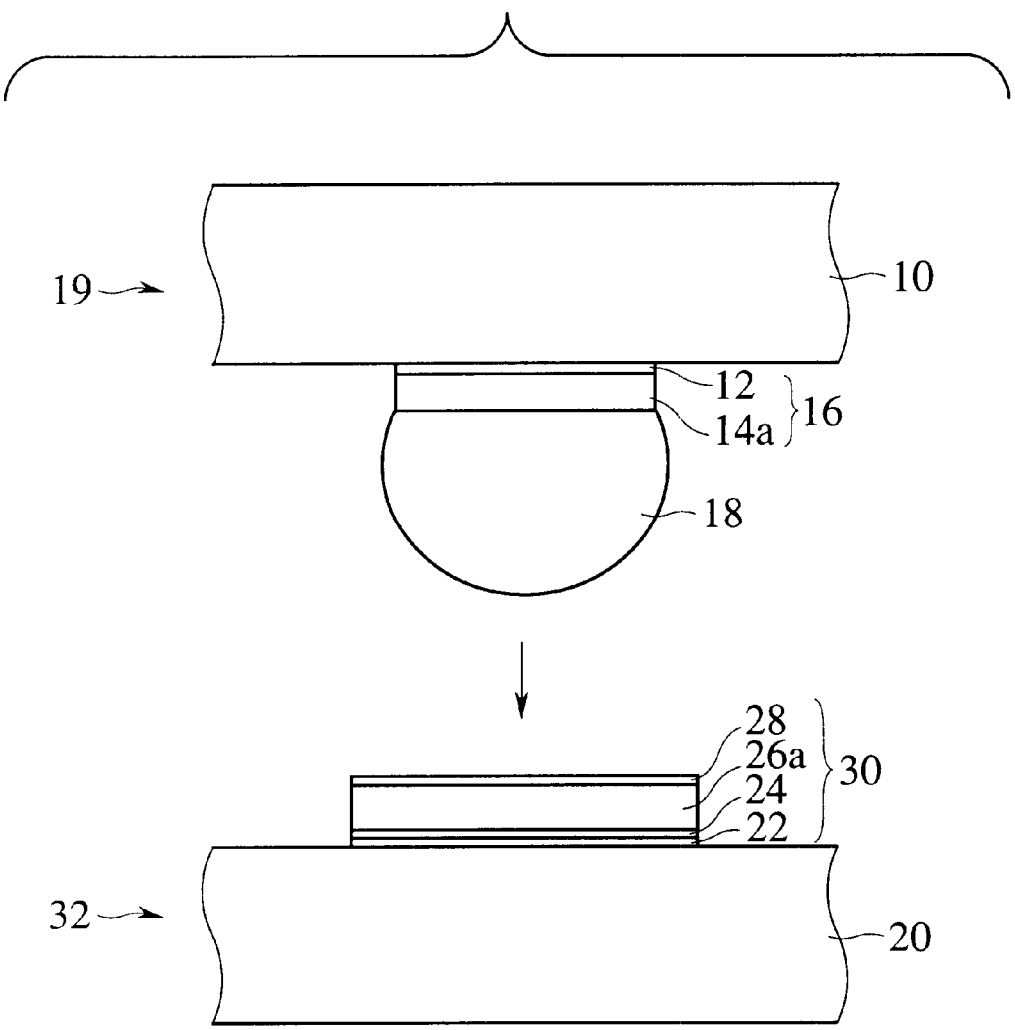
FIG. 2 is a sectional view showing the solder bonding method according to a second embodiment of the present invention.

The solder bonding method according tot a second embodiment of the present invention will be explained with reference to FIG. 2. FIG. 2 is a sectional view explaining the solder bonding method according to the present embodiment. The same members of the present embodiment as those of the solder bonding method according to the first embodiment of FIG. 1 are represented by the same reference numbers not to repeat or to simplify their explanation.

The solder bonding method according to the present embodiment is characterized mainly in that a plated film 14a containing Ni and B (boron) is formed on a Ti film 12, by electroless plating, and a plated film 26a containing Ni and B on a Cu film 24 by electroless plating.

The plated films 14a, 26a are subjected to the heat treatment as in the first embodiment. Boron contents of the plated films 14a, 26a may be, e.g., 5–20 wt %. The plated films 14a, 26a contain B, whereby the Ni of the plated films can be prevented from combining with the Sn in a solder pump, as can be prevented by the P in the plated films in the first embodiment. Accordingly, the present embodiment can provide electronic devices having the bonds in good states.

(Results of Reliability Evaluation Test)

Then, results of a reliability evaluation test made on electronic devices fabricated by using the above-described solder bonding method. Tables 3-1 to 4-2 show the results of the reliability evaluation test made on the electronic devices fabricated by using the solder bonding method according to the present embodiment.

As in the first embodiment, a diameter of the solder bump 18 was 70–100 $\mu$m. A pitch of the solder bump 18 with respect to an adjacent one was 150–210 $\mu$m. Film thicknesses of the plated films 14a, 26a were 6 $\mu$m as in the first embodiment. The reliability evaluation test was the same as in the first embodiment.

TABLE 3-1

|  | B Content in Plated Film (wt %) | Heat Treatment Temperature (° C.) | Heat Treatment Time (Hours) |
|---|---|---|---|
| Example 17 | 1 | 400 | 1 |
| Example 16 | 1 | 400 | 1 |

TABLE 3-1-continued

|  | B Content in Plated Film (wt %) | Heat Treatment Temperature (° C.) | Heat Treatment Time (Hours) |
|---|---|---|---|
| Example 19 | 1 | 400 | 1 |
| Example 20 | 1 | 400 | 1 |
| Example 21 | 10 | 400 | 1 |
| Example 22 | 10 | 400 | 1 |
| Example 23 | 10 | 400 | 1 |
| Example 24 | 10 | 400 | 1 |

TABLE 3-2

|  | Content of Elements other than Sn in Solder Bump (wt %) | Heat Cycle (Cycle) | Bonded State | Residual Film Thickness ($\mu$m) |
|---|---|---|---|---|
| Example 17 | Ag:3.5, Zn:5 | Above 300 | Good | 4 |
| Example 18 | Sb:5 | Above 300 | Good | 4 |
| Example 19 | Ag:3.5 | Above 300 | Good | 4 |
| Example 20 | Ag:3.5, In:5 | Above 300 | Good | 4 |
| Example 21 | Ag:3.5, Zn:5 | Above 300 | Good | 3 |
| Example 22 | Sb:5 | Above 300 | Good | 3 |
| Example 23 | Ag:3.5 | Above 300 | Good | 3 |
| Example 24 | Ag:3.5, In:5 | Above 300 | Good | 3 |

TABLE 4-1

|  | B Content in Plated Film (wt %) | Heat Treatment Temperature (° C.) | Heat Treatment Time (Hours) |
|---|---|---|---|
| Example 25 | 1 | 600 | 1 |
| Example 26 | 1 | 600 | 1 |
| Example 27 | 1 | 600 | 1 |
| Example 26 | 1 | 600 | 1 |
| Example 29 | 10 | 600 | 1 |
| Example 30 | 10 | 600 | 1 |
| Example 31 | 10 | 600 | 1 |
| Example 32 | 10 | 600 | 1 |

TABLE 4-2

|  | Content of Elements other than Sn in Solder Bump (wt %) | Heat Cycle (Cycle) | Bonded State | Residual Film Thickness ($\mu$m) |
|---|---|---|---|---|
| Example 25 | Ag:3.5, Zn:5 | Above 300 | Good | 4 |
| Example 26 | Sb:5 | Above 300 | Good | 4 |
| Example 27 | Ag:3.5 | Above 300 | Good | 4 |
| Example 26 | Ag:3.5, In:5 | Above 300 | Good | 4 |
| Example 29 | Ag:3.5, Zn:5 | Above 300 | Good | 4 |
| Example 30 | Sb:5 | Above 300 | Good | 4 |
| Example 31 | Ag:3.5 | Above 300 | Good | 4 |
| Example 32 | Ag:3.5, In:5 | Above 300 | Good | 4 |

As shown by Examples 17 to 32 in Tables 3-1 to 4-2, a residual film thickness of the plated film 26a was above 3 $\mu$m both with a 1 wt % B content and a 10 wt % B content. The bonded states were good.

As described above, according to the present embodiment, the plated film of Ni film formed by electroless plating are subjected to the heat treatment, and the B contained in such plated films can prevent the Ni of the plated films from combining with the Sn in the solder bump. Electronic devices having the bonds in good states can be provided.

[A Third Embodiment]

Figure 3:
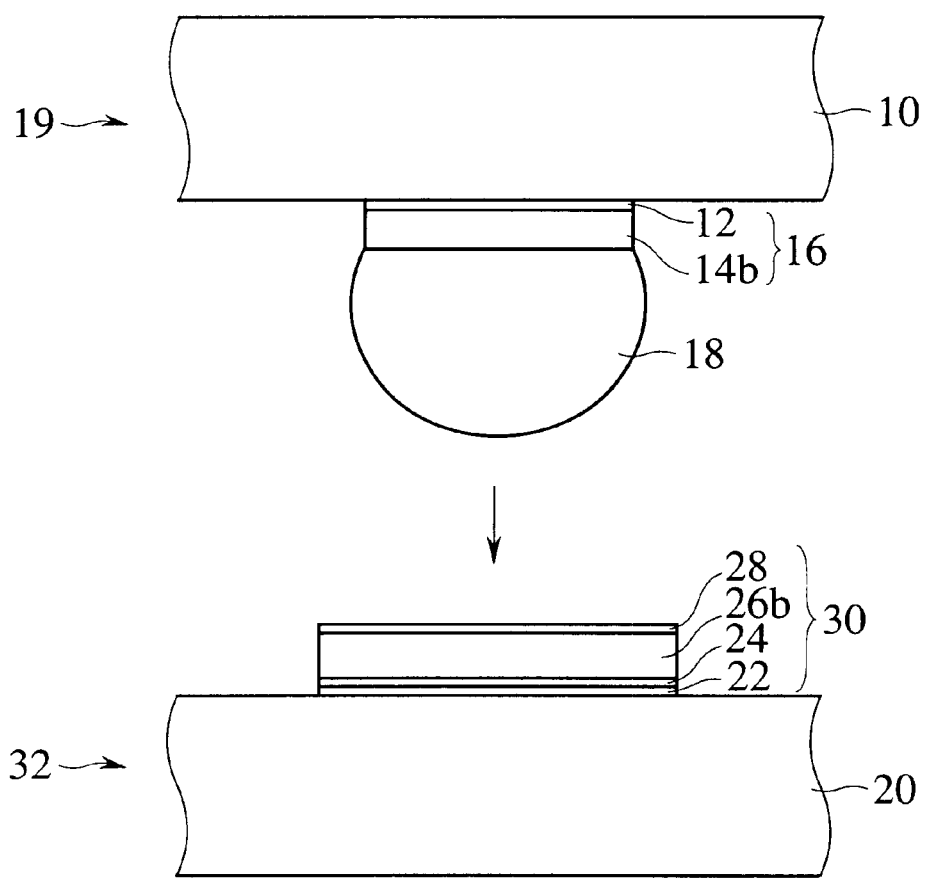
FIG. 3 is a sectional view showing the solder bonding method according to a second embodiment of the present invention.
Figure 4:
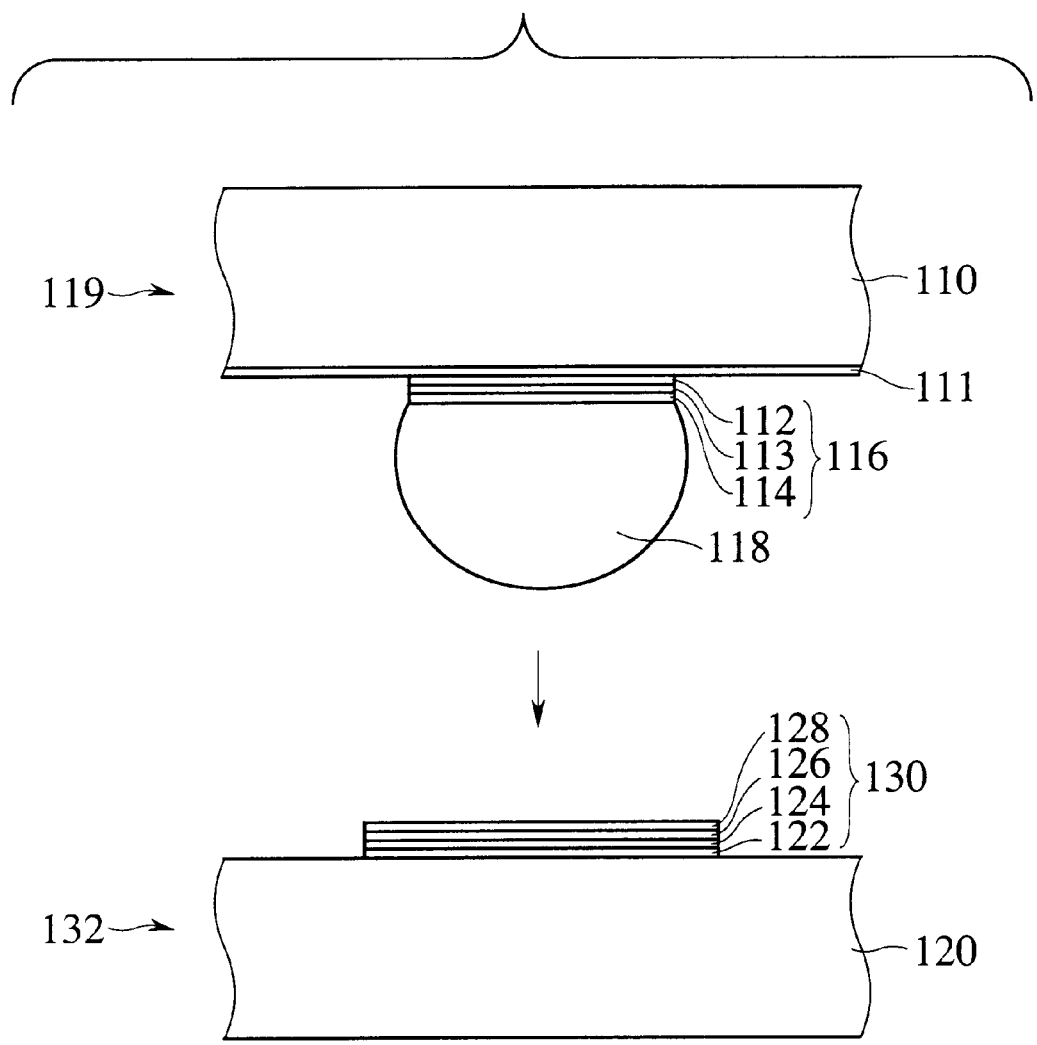
FIG. 4 is a sectional view showing the conventional solder bonding method.

The solder bonding method according to a third embodiment of the present invention will be explained with reference to FIG. 3. FIG. 3 is a sectional view explaining the solder bonding method according to the present embodiment. The same members of the present embodiment as those of the solder bonding method according to the first or the second embodiment shown in FIG. 1 or 2 are represented by the same reference numbers not to repeat or to simplify their explanation.

The solder bonding method according to the present embodiment is characterized mainly in that a plated film 14b containing Ni, W (tungsten) and P is formed on a Ti film 12 by electroless plating, and a plated film 26b containing Ni and B is formed on a Cu film 24 by electroless plating.

The plated films 14b, 26b are subjected to the heat treatment as in the first embodiment. Tungsten (W) contents the plated films 14b, 26b may be, e.g., 5–15 wt %. Phosphorus (P) contents of the plated films 14b, 26b may be, e.g., 5–10 wt %. The W and P contained in the plated films 14b, 26b can prevent the Ni of the plated films 14b, 26b from combining with the Sn in the solder bump. Accordingly, the present embodiment can provide electronic devices having the bonds in good states.

(Results of Reliability Evaluation Test)

Next, results of a reliability evaluation test made on electronic devices fabricated by using the above-described solder bonding method will be explained with reference to tables 5-1 to 6-2. Tables 5-1 to 6-2 show the results of the reliability evaluation test made on the electronic devices fabricated by using the solder bonding method according to the present embodiment.

As in the first embodiment, a diameter of the solder bump was 70–100 $\mu$m, and a pitch of the solder bump with respect to an adjacent one was 150–200 $\mu$m. Film thicknesses of the plated films 14b, 26b were 6 $\mu$m as in the first embodiment. The reliability evaluation test was the same as in the first embodiment. A P content was 5 wt %.

TABLE 5-1

|  | W Content in Plated Film (wt %) | Heat Treatment Temperature (° C.) | Heat Treatment Time (Hours) |
|---|---|---|---|
| Example 33 | 5 | 400 | 1 |
| Example 34 | 5 | 400 | 1 |
| Example 35 | 5 | 400 | 1 |
| Example 36 | 5 | 400 | 1 |
| Example 37 | 10 | 400 | 1 |
| Example 36 | 10 | 400 | 1 |
| Example 39 | 10 | 400 | 1 |
| Example 40 | 10 | 400 | 1 |

TABLE 5-2

|  | Content of Elements other than Sn in Solder Bump (wt %) | Heat Cycle (Cycle) | Bonded State | Residual Film Thickness ($\mu$m) |
|---|---|---|---|---|
| Example 33 | Ag:3.5, Zn:5 | Above 300 | Good | 4 |
| Example 34 | Sb:5 | Above 300 | Good | 4 |
| Example 35 | Ag:3.5 | Above 300 | Good | 4 |
| Example 36 | Ag:3.5, In:5 | Above 300 | Good | 4 |
| Example 37 | Ag:3.5, Zn:5 | Above 300 | Good | 3 |
| Example 38 | Sb:5 | Above 300 | Good | 3 |
| Example 39 | Ag:3.5 | Above 300 | Good | 3 |
| Example 40 | Ag:3.5, In:5 | Above 300 | Good | 3 |

TABLE 6-1

|  | W Content in Plated Film (wt %) | Heat Treatment Temperature (° C.) | Heat Treatment Time (Hours) |
| --- | --- | --- | --- |
| Example 41 | 5 | 600 | 1 |
| Example 42 | 5 | 600 | 1 |
| Example 43 | 5 | 600 | 1 |
| Example 44 | 5 | 600 | 1 |
| Example 45 | 10 | 600 | 1 |
| Example 46 | 10 | 600 | 1 |
| Example 47 | 10 | 600 | 1 |
| Example 48 | 10 | 600 | 1 |

TABLE 6-2

|  | Content of Elements other than Sn in Solder Bump (wt %) | Heat Cycle (Cycle) | Bonded State | Residual Film Thickness (μm) |
| --- | --- | --- | --- | --- |
| Example 41 | Ag:3.5, Zn:5 | Above 300 | Good | 4 |
| Example 42 | Sb:5 | Above 300 | Good | 4 |
| Example 43 | Ag:3.5 | Above 300 | Good | 4 |
| Example 44 | Ag:3.5, In:5 | Above 300 | Good | 4 |
| Example 45 | Ag:3.5, Zn:5 | Above 300 | Good | 4 |
| Example 46 | Sb:5 | Above 300 | Good | 4 |
| Example 47 | Ag:3.5 | Above 300 | Good | 4 |
| Example 46 | Ag:3.5, In:5 | Above 300 | Good | 4 |

As shown by Examples 33 to 48 in Tables 5-1 to 6-2, a residual film thickness of the plated films was above 3 μm both with a 5 wt % W content and a 10 wt % W content. The bonded states were good.

As described above, according to the present embodiment, the plated films of Ni films formed by electroless plating were subjected to the heat treatment, and the plated films contain W and P, whereby the Ni of the plated films can be prevented from combining with the Sn in the solder bump. Accordingly, electronic devices having the bonded states in good states can be fabricated.

[Modified Embodiments]

The present invention is not limited to the above-described embodiments and can cover other various modifications.

For example, a thickness of the plated films is not limited to the above-described thickness and may be suitably set so as to obtain required bonded states.

Contents of impurities, such as P, B, W, etc. contained in the plated films formed of Ni as a main component are not limited to those of the above-described embodiments and may be suitably set so as to prevent to a required extent, the Ni of the plated films from combining with the Sn in the solder bump.

In the above-described embodiments, the plated films contain impurities, such as P, etc., but impurities contained in the plated films are not limited to P, etc. The plated films may contain impurities other than P, etc. as long as the impurities can prevent the Ni of the plated films from combining with the Sn in the solder bump.

In the above-described embodiments, a heat treatment temperature was 400–600° C., and a heat treatment time was 0.5–2 hours. However, they are not limited to them and may be suitably set so that the plated films can have a required crystal state.

In the above-described embodiments, the solder bump was formed by dimple plating. However, the solder bump is not essentially formed by dimple plating and may be formed by, e.g., using a solder paste, vapor-depositing a solder alloy, or transfer.

The above-described embodiments exemplify cases that the circuit substrate and the semiconductor device are bonded to each other. The semiconductor device may be any semiconductor device, e.g., LSI or others. The above-described solder bonding method is applicable to fabrication of any electronic device, e.g., fabrication of multi-chip module, etc.

In the above-described embodiments, alumina substrates are used but are not essential. Any substrate, e.g., resin substrates, such as BT resin substrates, etc., glass epoxy substrates, AlN substrates, etc., may be used.

In the above-described embodiments, the plated films contain impurities, such as P, etc. However, the plated films may contain no impurity, such as P, etc. as long as the plated films are heat-treated, whereby the Ni of the plated films can be prevented, to a required extent, from combining with the Sn in the solder bump.

In the above-described embodiment, the plated films are heat-treated, but may not be heat-treated as long as the plated films contain impurities, such as P, etc., whereby the Ni of the plated films can be prevented, to a required extent, form combining with the Sn in the solder bump.

In the above-described embodiments, the plated films as P, etc., and are heat-treated as long as the plated films have sufficient thicknesses, whereby the bonded state can be good.

In the above-described embodiments, the plated films are formed by electroless plating but may not be essentially formed by electroless plating. The plated films may be formed by another film forming technique, such as electrolytic plating or others.

What is claimed is:

1. A solder bonding method comprising the step of solder bonding a first electrode to a second electrode having a solder bump of mainly Sn formed on an upper surface thereof,
    the first electrode and/or the second electrode including a metal layer of an alloy layer containing Ni and P, an alloy layer containing Ni and b, or an alloy layer containing Ni, W and P,
    the metal layer being formed by electroless plating, and
    the solder bump containing Pb as a non-main component.

2. A solder bonding method according to claim 1, further comprising
    the step of heat treating the metal layer before the solder bonding step.

3. A solder bonding method comprising the step of solder bonding a first electrode to a second electrode having a solder bump of mainly Sn formed on an upper surface thereof,
    the first electrode and/or the second electrode including a metal layer of mainly Ni,
    the metal layer being formed by electroless plating,
    the solder bump containing Pb as a non-main component, and
    the solder bonding step being followed by the step of heat treating the alloy layer.

4. An electronic device comprising a first substrate including a first electrode, a second substrate including a second electrode having a solder bump of mainly Sn formed on an upper surface thereof, the first electrode and the second electrode being solder bonded to each other, the first electrode and/or the second electrode including a metal layer of an alloy layer containing Ni and P, an alloy layer containing Ni and B, or an alloy layer containing Ni, W and P.

5. An electronic device fabrication process comprising the step of solder bonding a first electrode formed on a first substrate to a second electrode which is formed on a second substrate and has a solder bump of mainly Sn formed on an upper surface thereof, the first electrode and/or the second electrode including a metal layer of an alloy layer containing Ni and P, an alloy layer containing Ni and B, or an alloy layer containing Ni, W and P, the metal layer being formed by electroless plating, and the solder bump containing Pb as a non-main component.

6. An electronic device fabrication process according to claim 5, further comprising the step of heat treating the metal layer before the solder bonding step.

7. An electronic device fabrication process comprising the step of solder bonding a first electrode formed on a first substrate to a second electrode which is formed on a second substrate and has a solder bump of mainly Sn formed on an upper surface thereof, the first electrode and/or the second electrode including a metal layer of mainly Ni, the metal layer being formed by electroless plating, the solder bump containing Pb as a non-main component, and the step of heat treating the metal layer being followed by the solder bonding step.

* * * * *